(12) United States Patent
Kanemoto

(10) Patent No.: US 9,083,309 B2
(45) Date of Patent: *Jul. 14, 2015

(54) MICROELECTRONIC DEVICE AND ELECTRONIC APPARATUS

(75) Inventor: Yoko Kanemoto, Fujimi (JP)

(73) Assignee: Seiko Epson Corporation (JP)

( * ) Notice: Subject to any disclaimer, the term of this patent is extended or adjusted under 35 U.S.C. 154(b) by 80 days.

This patent is subject to a terminal disclaimer.

(21) Appl. No.: 13/297,692

(22) Filed: Nov. 16, 2011

(65) Prior Publication Data

US 2012/0133449 A1 May 31, 2012

(30) Foreign Application Priority Data

Nov. 30, 2010 (JP) ................. 2010-266217

(51) Int. Cl.
| | | |
|---|---|---|
| *H01L 21/00* | (2006.01) | |
| *H03H 9/24* | (2006.01) | |
| *B81B 3/00* | (2006.01) | |
| *B81C 1/00* | (2006.01) | |
| *H03H 9/02* | (2006.01) | |

(52) U.S. Cl.
CPC ............ *H03H 9/2457* (2013.01); *B81B 3/0013* (2013.01); *B81C 1/00968* (2013.01); *B81B 2201/0271* (2013.01); *B81B 2203/0118* (2013.01); *H03H 2009/02511* (2013.01)

(58) Field of Classification Search
CPC .. B81B 3/0013; B81B 3/0002; B81C 1/0096; B81C 1/00968; B81C 1/00976; B81C 1/00984; H03H 9/2457
USPC ............... 438/52; 331/154; 216/13; 361/748; 174/260; 29/852; 257/E21.158
See application file for complete search history.

(56) References Cited

U.S. PATENT DOCUMENTS

| | | |
|---|---|---|
| 7,215,061 B2 | 5/2007 | Kihara et al. |
| 7,408,434 B2 | 8/2008 | Lee et al. |
| 7,667,559 B2 | 2/2010 | Yamanaka et al. |
| 7,709,285 B2 | 5/2010 | Van Beek et al. |
| 7,709,912 B2 | 5/2010 | Sato et al. |
| 7,880,245 B2 | 2/2011 | Sato et al. |
| 8,026,120 B2 | 9/2011 | Kihara et al. |

(Continued)

FOREIGN PATENT DOCUMENTS

| | | |
|---|---|---|
| JP | 06-138142 | 5/1994 |
| JP | 2005-265565 | 9/2005 |

(Continued)

OTHER PUBLICATIONS

D. Sparks, et al. "Chip-Level Vacuum Packaging of Micromachines Using NanoGetters", IEEE Transactions on Advanced Packaging, vol. 26, No. 3, Aug. 2003 (10 pages).

(Continued)

*Primary Examiner* — Thao X Le
*Assistant Examiner* — Gardner W Swan
(74) *Attorney, Agent, or Firm* — Harness, Dickey & Pierce, P.L.C.

(57) ABSTRACT

A movable section located in a hollow portion covered with a wall and a first sealing layer which are on a substrate and the first sealing layer located in an area facing the movable section are provided, the movable section is located between the substrate and the first sealing layer, and at least part of the movable section and the first sealing layer is an electric conductor.

13 Claims, 8 Drawing Sheets

(56) References Cited

U.S. PATENT DOCUMENTS

| | | |
|---|---|---|
| 8,035,949 B2 | 10/2011 | Miyano |
| 8,097,483 B2 | 1/2012 | Van Schaijk et al. |
| 8,631,700 B2 | 1/2014 | Sammoura et al. |
| 2005/0151442 A1 | 7/2005 | Kihara et al. |
| 2005/0189621 A1 | 9/2005 | Cheung |
| 2005/0189845 A1 | 9/2005 | Kihara |
| 2007/0018761 A1* | 1/2007 | Yamanaka et al. ............. 335/78 |
| 2008/0079142 A1 | 4/2008 | Carmona et al. |
| 2009/0108381 A1 | 4/2009 | Buchwalter et al. |
| 2009/0284892 A1 | 11/2009 | Miyano |
| 2009/0309613 A1* | 12/2009 | Hollocher et al. ............. 324/661 |
| 2010/0087024 A1 | 4/2010 | Hawat et al. |
| 2010/0116632 A1* | 5/2010 | Smith et al. .................. 200/181 |
| 2010/0176898 A1 | 7/2010 | Kihara |
| 2010/0178717 A1 | 7/2010 | Kihara et al. |
| 2010/0237738 A1* | 9/2010 | Smith et al. .................. 310/309 |
| 2011/0089521 A1 | 4/2011 | Sato et al. |
| 2011/0115036 A1 | 5/2011 | Moon et al. |
| 2011/0306153 A1 | 12/2011 | Kihara et al. |
| 2012/0007527 A1 | 1/2012 | Miyano |
| 2012/0134121 A1* | 5/2012 | Kanemoto et al. ............. 361/748 |
| 2013/0140655 A1 | 6/2013 | Yeh et al. |

FOREIGN PATENT DOCUMENTS

| | | |
|---|---|---|
| JP | 2005-271191 A | 10/2005 |
| JP | 2005-278385 A | 10/2005 |
| JP | 2006-005731 A | 1/2006 |
| JP | 2006-217207 A | 8/2006 |
| JP | 2006-224220 A | 8/2006 |
| JP | 2006-247820 | 9/2006 |
| JP | 2006-303558 A | 11/2006 |
| JP | 2006-319387 A | 11/2006 |
| JP | 2007-035290 A | 2/2007 |
| JP | 2007-513782 A | 5/2007 |
| JP | 2007-175577 A | 7/2007 |
| JP | 2007-184747 A | 7/2007 |
| JP | 2007-184815 A | 7/2007 |
| JP | 2008-091167 | 4/2008 |
| JP | 2008-091334 A | 4/2008 |
| JP | 2008-114354 | 5/2008 |
| JP | 2008-193638 A | 8/2008 |
| JP | 2009-105411 | 5/2009 |
| JP | 2009-201317 | 9/2009 |
| JP | 2009-212887 A | 9/2009 |
| JP | 2009-212888 A | 9/2009 |
| JP | 2009-253155 A | 10/2009 |
| JP | 2009-005408 A | 7/2010 |
| JP | 2010-158734 A | 7/2010 |
| JP | 2010-162629 A | 7/2010 |
| JP | 2010-166201 A | 7/2010 |
| JP | 2010-221372 A | 10/2010 |

OTHER PUBLICATIONS

Lei Mei et al, "Study of Amine-Cured Epoxy Resin/Aluminum Oxide Interfacial Interaction", Center for Composition Material, Harbin Institute of Technology, Harbin 150006, State Key Laboratory of Polymer Physics and Chemistry, Institute of Chemistry, Chinese Academy of Sciences, Beijing 100080, Key Engineering Materials, vol. 334-335, 2007, pp. 177-180.

* cited by examiner

MICROELECTRONIC DEVICE AND ELECTRONIC APPARATUS

BACKGROUND

1. Technical Field

The present invention relates to electronic devices, an electronic apparatus, and a method for producing the electronic device.

2. Related Art

An electronic device in which a functional element formed by using MEMS (micro electro mechanical systems) is placed in a hollow portion provided on a substrate has been known. The functional element is a micro vibrator, a micro sensor, or the like, in which a minute structure performs operations such as vibration and deformation. The pressure in the hollow portion is reduced to make it easier for the functional element to operate.

The method for forming the hollow portion is disclosed in JP-A-2009-105411. According to this method, a MEMS structure is formed on a substrate, and an interlayer dielectric is formed on the MEMS structure. Then, a first covering layer having a through-hole is formed so as to cover the interlayer dielectric around the MEMS structure. Next, by making etchant flow through the through-hole of the first covering layer, the interlayer dielectric is removed, whereby a movable section of the MEMS structure is made to be movable. Finally, by covering the through-hole of the first covering layer with a second covering layer, an enclosed cavity is formed around the MEMS structure. Hereinafter, the first covering layer is referred to as a covering section.

There are cases where, in the MEMS structure formed in the enclosed cavity, the structures or the structure and the part forming the cavity stick to each other and do not separate from each other in the production process or the operation process of the MEMS structure. Therefore, an electronic device that can separate the structures which have stuck to each other has been sought after.

SUMMARY

An advantage of some aspects of the invention is to solve at least part of the problems described above, and the invention can be realized as forms or application examples described below.

Application Example 1

An electronic device according to this application example includes: a movable section located in a hollow portion covered with a covering section on a substrate; a lid section located in the covering section in an area facing the movable section; and a side wall insulating film that is located in the covering section between the substrate and the lid section and provides isolation between the substrate and the lid section, the movable section is located between the substrate and the lid section, and at least part of the movable section and a portion of the covering section, the portion closer to the lid section than the side wall insulating film, is an electric conductor. According to this electronic device, the hollow portion covered with the covering section is provided on the substrate. In the hollow portion, the movable section is disposed. The covering section in an area facing the movable section is the lid section. In addition, the movable section is located between the covering section and the substrate. The movable section and the lid section are electric conductors and are insulated from each other by the side wall insulating film. Therefore, by applying a voltage to the movable section and the lid section, it is possible to accumulate static electricity in the movable section and the lid section. This makes it possible to generate the attractive force between the movable section and the lid section. There are cases where the movable section sticks to the substrate and does not separate therefrom in the production process or operation process. In such a case, it is possible to separate the movable section from the substrate by generating the attractive force between the movable section and the lid section.

Application Example 2

In the electronic device according to the application example described above, a fixing section is further provided on the substrate, the fixing section is located in an area facing the movable section, and at least part of the fixing section is an electric conductor.

According to this electronic device, the fixing section is located in an area facing the movable section. Therefore, by applying a voltage to the movable section and the fixing section, it is possible to accumulate static electricity in the movable section and the fixing section. This makes it possible to generate the attractive force between the movable section and the fixing section. As a result, when the movable section sticks to the lid section and does not separate therefrom, it is also possible to separate the movable section from the lid section by generating the attractive force between the movable section and the fixing section.

Application Example 3

In the electronic device according to the application example described above, the side wall insulating film is located in a position closer to the lid section than the movable section. According to this electronic device, the side wall insulating film is disposed between the substrate's side and the lid section's side in the covering section. The side wall insulating film provides isolation between the substrate's-side covering section and the lid section's-side covering section. The side wall insulating film is located in a position closer to the lid section than the movable section. The side wall insulating film is formed by a process performed after the substrate's-side covering section is formed. In addition, the side wall insulating film is formed by forming a wide film and then etching the film so as to leave an area which abuts on the covering section.

When the side wall insulating film is located in a position closer to the substrate than the movable section, there is a possibility that the side wall insulating film which is not yet etched makes contact with the movable section. In addition, when the side wall insulating film is etched, since the etchant makes contact with the movable section, there is a possibility that the movable section is damaged by the etchant. On the other hand, in this application example, the side wall insulating film is located in a position closer to the lid section than the movable section. Therefore, by disposing a predetermined component between an area in which the side wall insulating film is disposed and the substrate, it is possible to form the side wall insulating film in such a way that the side wall insulating film which is not yet etched does not make contact with the movable section. In addition, by removing the component around the movable section after etching the side wall insulating film, it is possible to prevent the etchant from damaging the movable section when the side wall insulating film is etched.

Application Example 4

In the electronic device according to the application example described above, a voltage circuit outputting a voltage which is applied between the lid section and the movable section and a switch section switching between a state in which the voltage is applied between the lid section and the movable section and a state in which the voltage is not applied between the lid section and the movable section are provided.

According to this electronic device, the voltage circuit can generate a voltage and, by using the switch section, switch between a state in which the voltage is applied between the lid section and the movable section and a state in which the voltage is not applied between the lid section and the movable section. Therefore, it is possible to control the attractive force so as to act on or not to act on between the lid section and the movable section.

Application Example 5

In the electronic device according to the application example described above, the fixing section is a fixed electrode, and a first distance which is the distance between the lid section and the movable section is greater than a second distance which is the distance between the movable section and the fixed electrode.

According to this electronic device, the fixed electrode, the movable section, and the lid section are disposed in such a way that the first distance becomes greater than the second distance. As a result, the movable section is located in a position closer to the fixed electrode than the lid section. Therefore, the movable section sticks to the fixed electrode more easily than to the lid section. However, the movable section may stick to both the lid section and the fixed electrode at a different time, it is necessary to provide the switch section that controls the attractive force between the movable section and the lid section and provide the switch section that controls the attractive force between the movable section and the fixed electrode. On the other hand, in this application example, it is necessary to provide only the switch section that controls the attractive force between the movable section and the lid section. This makes it possible to simplify the control of the switch section.

Application Example 6

In the electronic device according to the application example described above, an oscillating circuit generating a waveform by using the movable section is provided.

According to this electronic device, the electronic device includes the oscillating circuit, and the oscillating circuit can generate a waveform by using the movable section. The movable section has a natural frequency. Therefore, the oscillating circuit can output a waveform of a predetermined frequency.

Application Example 7

An electronic apparatus according to this application example includes the electronic device described above.

According to this electronic apparatus, an electronic device in which at least part of the movable section and the lid section is an electric conductor is provided. Therefore, the electronic apparatus can be provided as an electronic apparatus including an electronic device that can operate, even when the movable section sticks to the substrate, by separating the movable section from the substrate.

Application Example 8

A method for producing an electronic device, the method according to this application example, includes an interlayer dielectric forming process in which an interlayer dielectric is formed on a substrate and a conductive movable section formed on the substrate; a side wall forming process in which the interlayer dielectric is cylindrically removed so as to surround the conductive movable section and a side wall section is formed in an area from which the interlayer dielectric is removed; a lid section forming process in which a conductive lid section having an opening is formed so as to be placed on the side wall section and the interlayer dielectric surrounded with the side wall section; a protective film forming process in which a protective film is formed on the interlayer dielectric surrounding the side wall section; a hollow portion forming process in which a hollow portion is formed by removing the interlayer dielectric in an area surrounded with the substrate, the side wall section, and the lid section by making etchant flow through the opening; and a sealing process in which the opening is sealed, and the side wall forming process has a process in which a side wall insulating film is formed in the conductive side wall section all around the side wall section.

According to this method for producing an electronic device, in the interlayer dielectric forming process, the interlayer dielectric is formed on the substrate and the conductive movable section formed on the substrate. In the side wall forming process, the interlayer dielectric is cylindrically removed so as to surround the conductive movable section, and the conductive side wall section is formed in an area from which the interlayer dielectric is removed. In addition, the side wall insulating film is formed in the conductive side wall section or at the end of the conductive side wall section all around the side wall. In the lid section forming process, the lid section having an opening is formed so as to be placed on the side wall section and the interlayer dielectric surrounded with the side wall section. In the protective film forming process, the protective film is formed on the interlayer dielectric surrounding the side wall section. In the hollow portion forming process, the hollow portion is formed by removing the interlayer dielectric in an area surrounded with the substrate, the side wall section, and the lid section by making the etchant flowing through the opening. In the sealing process, the opening is sealed.

The movable section is formed on the substrate, and the side wall is disposed so as to surround the movable section. The lid section is formed so as to be placed on the side wall, and the hollow portion is formed in an area surrounded with the side wall and the lid section. Therefore, the area around the movable section is the hollow portion. The side wall is formed as layers of a conductive portion and the side wall insulating film. Therefore, the lid section is insulated from the substrate's-side covering section, and the lid section is insulated from the movable section. By applying a voltage to the movable section and the lid section, it is possible to accumulate static electricity in the movable section and the lid section. This makes it possible to generate the attractive force between the movable section and the lid section. When the movable section sticks to the substrate and does not separate therefrom, it is possible to separate the movable section from the substrate by generating the attractive force between the movable section and the lid section.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
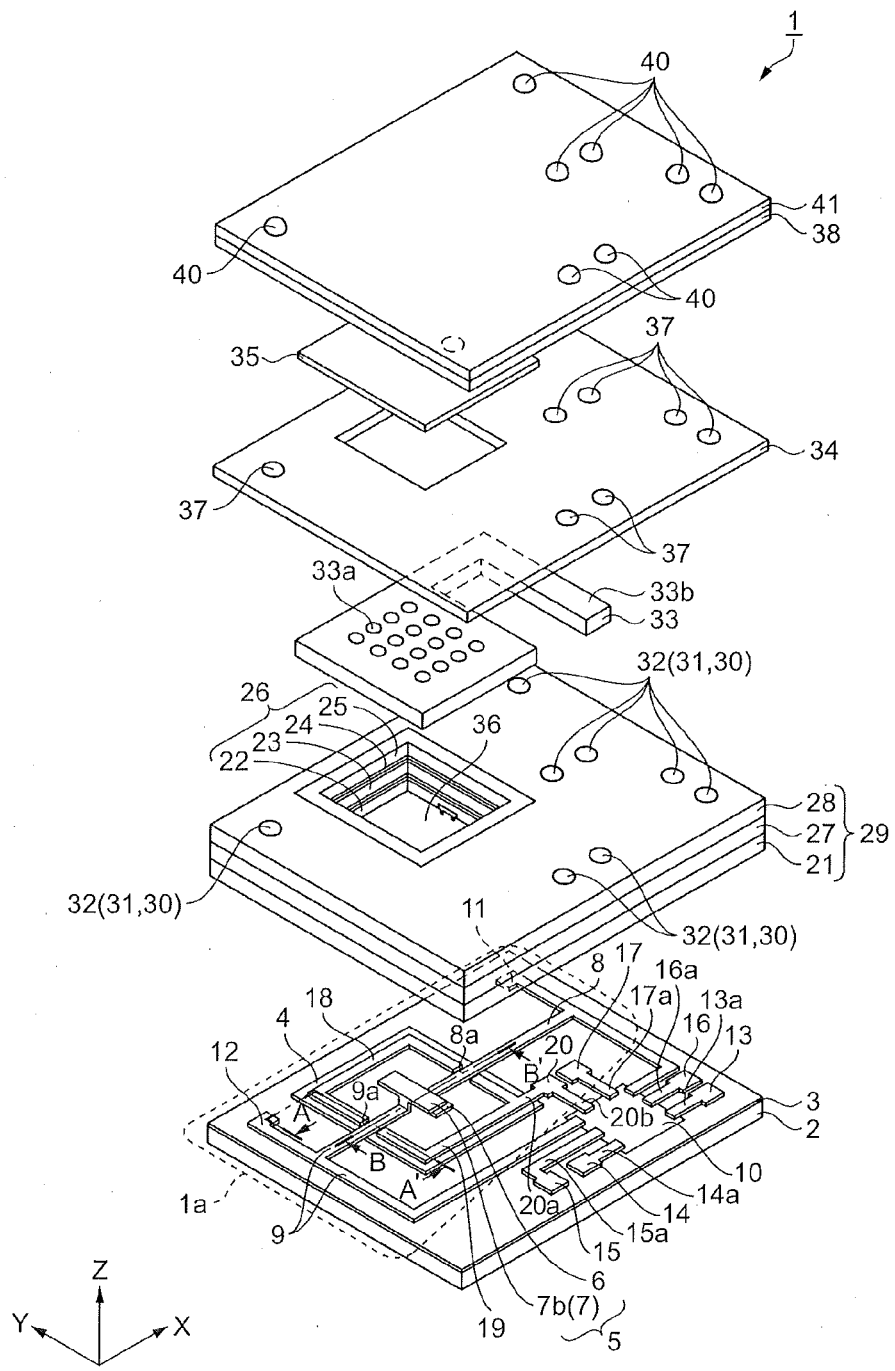
FIG. 1 is a schematic exploded perspective view showing the structure of an oscillator according to a first embodiment.

Hereinafter, embodiments of the invention will be described in accordance with the drawings. Incidentally, component elements in the drawings are illustrated on different scales to make the component elements have recognizable sizes in the drawings.

First Embodiment

Figure 2A:
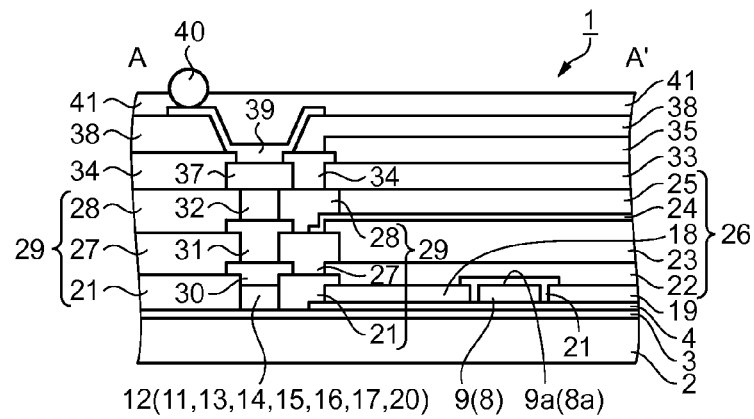
FIGS. 2A to 2C are schematic sectional views of principal portions of the oscillator.
Figure 2B:
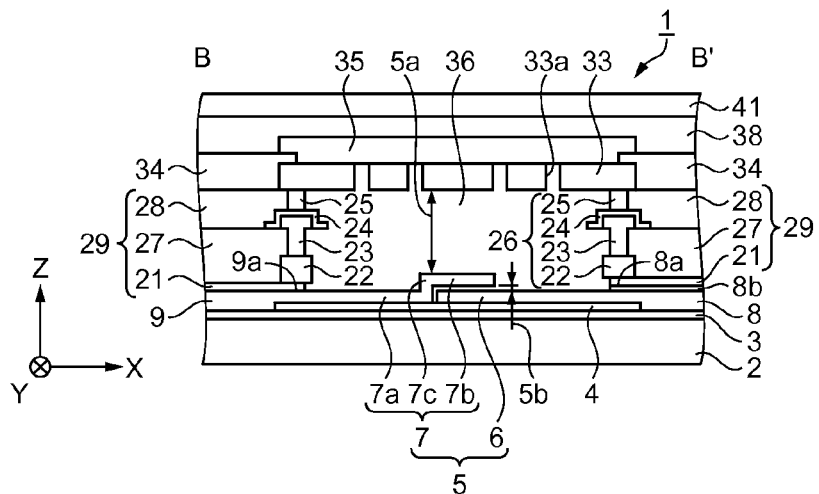
Figure 2C:
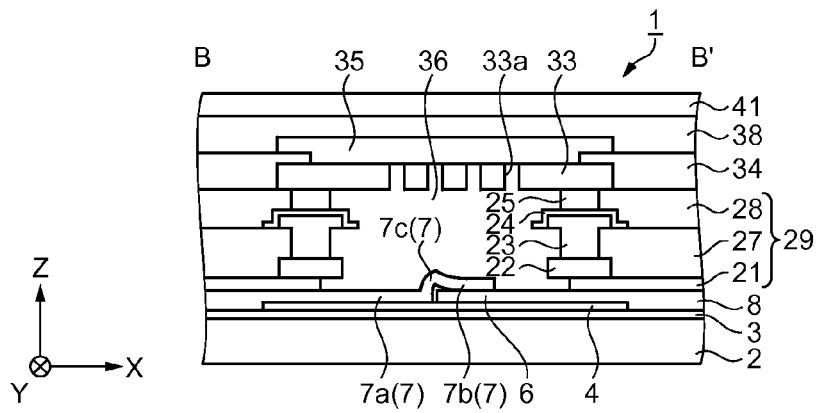

In this embodiment, an oscillator that has a vibrating element in a hollow portion and outputs a waveform of a predetermined frequency and a characteristic example of a method for producing the oscillator will be described in accordance with FIG. 1 to FIGS. 7A to 7D.
Oscillator FIG. 1 is a schematic exploded perspective view showing the structure of the oscillator. FIG. 2A is a schematic sectional view of principal portions of the oscillator of FIG. 1, the schematic sectional view taken on the line A-A' of FIG. 1. FIGS. 2B and 2C are schematic sectional views of principal portions of the oscillator of FIG. 1, the schematic sectional views taken on the line B-B' of FIG. 1. First, an oscillator 1 will be described in accordance with FIG. 1 and FIGS. 2A to 2C. The oscillator 1 as an electronic device includes a rectangular substrate 2. A longitudinal direction of the substrate 2 is assumed to be an X direction, and a direction perpendicular to the X direction in a planar direction of the substrate 2 is assumed to be a Y direction. A thickness direction of the substrate 2 is assumed to be a Z direction. The material of the substrate 2 is not limited to a particular material, and various kinds of substrates such as a semiconductor substrate such as a silicon substrate, a ceramic substrate, a glass substrate, a sapphire substrate, and a synthetic resin substrate can be used. When an integrated circuit formed of a semiconductor is formed on the substrate 2, a semiconductor substrate such as a silicon substrate is used. In this embodiment, a silicon substrate, for example, is adopted. The thickness of the substrate 2 is not limited to a particular thickness; in this embodiment, a thickness of 200 to 600 µm, for example, is adopted.

On the substrate 2, a first underlayer 3 is formed. As the first underlayer 3, a trench insulating layer, a LOCOS (local oxidation of silicon) insulating layer, or a semi-recessed LOCOS insulating layer, for example, can be used. The first underlayer 3 is an insulating layer that provides electrical isolation between a plurality of elements formed on the substrate 2.

On part of the first underlayer 3, a second underlayer 4 is formed. The material of the second underlayer 4 is not limited to a particular material; any material can be used as long as it is resistant to corrosion by the etchant that etches a silicon dioxide film. For example, alumina can be used as the material of the second underlayer 4. Thus, the second underlayer functions as an etching stopper layer when an etching process is performed above the second underlayer 4.

On the second underlayer 4, a first trace 8 as a trace and a second trace 9 as a trace are provided. The first trace 8 is connected to the fixed electrode 6, and the second trace 9 is connected to the movable electrode 7. On the first underlayer 3, a drive circuit 10 is provided, and, on the second underlayer 4, a first intermediate terminal 11 and a second intermediate terminal 12 are provided. One end of the first trace 8 is connected to the drive circuit 10, and the other end of the first trace 8 is connected to the first intermediate terminal 11. One end of the second trace 9 is connected to the drive circuit 10, and the other end of the second trace 9 is connected to the second intermediate terminal 12. By detecting a voltage between the first intermediate terminal 11 and the second intermediate terminal 12, it is possible to detect a voltage signal which is applied to the vibrating element 5.

The drive circuit 10 is formed of electrical elements such as a transistor and a capacitor, and outputs a drive signal to the vibrating element 5. On the first underlayer 3, a third intermediate terminal 13, a fourth intermediate terminal 14, a fifth intermediate terminal 15, a sixth intermediate terminal 16, and a seventh intermediate terminal 17 are provided. The third intermediate terminal 13 and the drive circuit 10 are connected by a trace 13a, and the fourth intermediate terminal 14 and the drive circuit 10 are connected by a trace 14a. Similarly, the fifth intermediate terminal 15 and the drive circuit 10 are connected by a trace 15a, and the sixth intermediate terminal 16 and the drive circuit 10 are connected by a trace 16a. The seventh intermediate terminal 17 and the drive circuit 10 are connected by a trace 17a.

The third intermediate terminal 13 is a terminal for a ground line, and the fourth intermediate terminal 14 is a terminal for power supply. The fifth intermediate terminal 15 is a terminal for signal output. The sixth intermediate terminal 16 is a terminal to which a signal instructing an operation to separate the movable electrode 7 from the fixed electrode 6 is input when the movable electrode 7 and the fixed electrode stick to each other and the movable electrode 7 stops vibrating. The seventh intermediate terminal 17 is a terminal from which a voltage that is supplied to separate the movable electrode 7 from the fixed electrode 6 is output.

The drive circuit 10 is a circuit generating a voltage signal of a predetermined frequency, and outputs the generated voltage signal to the fifth intermediate terminal 15. In other words, the oscillator 1 is an oscillator in which the vibrating element 5 and the drive circuit 10 are provided on the same substrate 2. Of the oscillator 1, parts other than the drive circuit 10 are referred to as a resonator 1a.

On the second underlayer 4, a first wall 18 is disposed on the Y direction's-side of the vibrating element 5, and a second wall 19 is disposed on the –Y direction's-side of the vibrating element 5. One end of the first wall 18 is disposed so as to extend to a position near the first trace 8, and the other end of the first wall 18 is disposed so as to extend to a position near the second trace 9. Similarly, one end of the second wall 19 is disposed so as to extend to a position near the first trace 8, and the other end of the second wall 19 is disposed so as to extend to a position near the second trace 9.

An area in which the first wall 18 and the second wall 19 are disposed in mutual proximity in such a way as to sandwich the first trace 8 is referred to as a first penetration section 8a. In an area of the first trace 8, the area which is farther from the vibrating element 5 than the first penetration section 8a, an insulating film 8b is provided. The insulating film 8b is a film formed by oxidizing the surface of the first trace 8. Similarly, an area in which the first wall 18 and the second wall 19 are disposed in mutual proximity in such a way as to sandwich the second trace 9 is referred to as a second penetration section 9a. Near the second wall 19, an eighth intermediate terminal 20 is provided, and the second wall 19 and the eighth intermediate terminal 20 are connected by a trace 20a. Furthermore, the eighth intermediate terminal 20 and the drive circuit 10 are connected by a trace 20b.

In the first penetration section 8a, a first insulating layer 21 is disposed so as to cover the first trace 8. In the first penetration section 8a, the first insulating layer 21 is disposed between the first trace 8 and the first wall 18 and between the first trace 8 and the second wall 19. As a result, the first trace 8 is insulated from the first wall 18 and the second wall 19.

Similarly, in the second penetration section 9a, the first insulating layer 21 is disposed so as to cover the second trace 9. In the second penetration section 9a, the first insulating layer 21 is disposed between the second trace 9 and the first wall 18 and between the second trace 9 and the second wall 19. As a result, the second trace 9 is insulated from the first wall 18 and the second wall 19.

The vibrating element 5, the first trace 8, the second trace 9, the first intermediate terminal 11, the second intermediate terminal 12, the eighth intermediate terminal 20, the first wall 18, and the second wall 19 are formed of the same material. The material is not limited to a particular material, and any material can be used as long as it has electric conductivity and is resistant to corrosion by etchant for silicon dioxide. As the material, metal, electroconductive silicon, or the like can be adopted. In this embodiment, for example, polycrystalline silicon provided with electric conductivity as a result of being doped with impurities such as phosphorus or boron is used. The third to seventh intermediate terminals 13 to 17 and the traces 13a to 17a may be formed of any material as long as the material has electrical conductivity. For example, polycrystalline silicon, metal, or the like can be used. In this embodiment, an alloy of aluminum and copper, for example, is adopted.

On the first wall 18, the second wall 19, and the first insulating layer 21 in the first penetration section 8a and the second penetration section 9a, a third wall 22 is disposed. A fourth wall 23 is disposed so as to be placed on the third wall 22, and a side wall insulating film 24 is disposed so as to be placed on the fourth wall 23. Furthermore, a fifth wall 25 is disposed so as to be placed on the side wall insulating film 24. The side wall insulating film 24 provides electric isolation between the fourth wall 23 and the fifth wall 25. The third wall 22, the fourth wall 23, the side wall insulating film 24, and the fifth wall 25 are shaped like a rectangular frame, and are disposed so as to surround the vibrating element 5. The first wall 18, the second wall 19, the third wall 22, the fourth wall 23, the side wall insulating film 24, and the fifth wall 25 form a wall 26 surrounding the vibrating element 5.

The third wall 22, the fourth wall 23, and the fifth wall 25 may be formed of any material as long as the material has electrical conductivity and structural strength and is resistant to corrosion by etchant for silicon dioxide. As the material, polycrystalline silicon, metal such as aluminum, copper, tungsten, and titanium, and an alloy thereof can be used. In this embodiment, an alloy of aluminum and copper, for example, is adopted.

The side wall insulating film 24 may be formed of any material as long as the material has electrical insulation properties and is resistant to corrosion by the etchant that etches silicon dioxide. As the material, alumina, $Si_3N_4$, polyimide resin, acrylic resin, novolac resin, diazonaphthoquinone resin, or the like can be suitably used. In this embodiment, alumina, for example, is adopted.

The first wall 18, the second wall 19, the third wall 22, and the fourth wall 23 are formed of an electroconductive material and are electrically connected to one another. In addition, the eighth intermediate terminal 20 is electrically connected to the second wall 19. Therefore, the first wall 18, the second wall 19, the third wall 22, the fourth wall 23, and the eighth intermediate terminal 20 are at the same potential. The first trace 8 is surrounded with the first wall 18, the second wall 19, and the third wall 22 via the first insulating layer 21. The first insulating layer 21 is formed of a material having electrical insulation properties. As a result, the first trace 8 is electrically-insulated from the first wall 18, the second wall 19, and the third wall 22. Similarly, the second trace 9 is surrounded with the first wall 18, the second wall 19, and the third wall 22 via the first insulating layer 21. As a result, the second trace 9 is electrically-insulated from the first wall 18, the second wall 19, and the third wall 22. Around the wall 26, an insulating layer 29 as an interlayer dielectric in which the first insulating layer 21, a second insulating layer 27, and a third insulating layer 28 are stacked in this order is disposed. The first insulating layer 21 is provided from between the first wall 18 and the second wall 19 to the area around the wall 26. The insulating layer 29 may be formed of any material as long as the material has electrical insulation properties and can be removed by etchant. For example, silicon dioxide can be used as the material of the insulating layer 29.

On the first to seventh intermediate terminals 11 to 17 and the eighth intermediate terminal 20, a first penetration electrode 30 is disposed so as to be placed on these terminals, and a second penetration electrode 31 and a third penetration electrode 32 are disposed in this order so as to be placed on the first penetration electrode 30. The first penetration electrode 30, the second penetration electrode 31, and the third penetration electrode 32 are electrodes that are formed of an electric conductor and the like and penetrate the first insulating layer 21 and the third insulating layer 28.

On the wall 26, a first sealing layer 33 as a covering section and a lid section is disposed so as to put a lid on the wall 26. In the first sealing layer 33, a plurality of through-holes 33a as openings are formed. The number of the through-holes 33a and the size thereof are not limited to particular number and size. In this embodiment, 16 through-holes 33a are formed in the first sealing layer 33.

On the X direction's-side of the first sealing layer 33, a trace 33b connected to the first sealing layer 33 is provided. The trace 33b is connected to the seventh intermediate terminal 17 via the first penetration electrode 30 and the second penetration electrode 31. This allows the drive circuit 10 to apply a predetermined voltage to the first sealing layer 33.

The material of the first sealing layer 33 is not limited to a particular material as long as it has electrical conductivity and structural strength and is resistant to corrosion by the etchant that etches silicon dioxide. In this embodiment, for example, a stacking structure in which a titanium layer, a titanium nitride layer, an aluminum-copper alloy layer, and a titanium nitride layer are stacked in this order is adopted. A protective film 34 is stacked so as to be placed on a part located on the periphery of the first sealing layer 33 and on the third insulating layer 28. The protective film 34 is disposed so as not to block the through-holes 33a. The material of the protective film 34 is not limited to a particular material as long as it is resistant to corrosion by the etchant that etches silicon dioxide. As the material of the protective film 34, a TEOS (tetraethoxysilane) oxide film, silicon nitride, and the like can be used. In this embodiment, as the material of the protective film 34, a film formed by stacking a TEOS oxide film and silicon nitride, for example, is adopted.

A second sealing layer 35 is stacked on the first sealing layer 33. The second sealing layer 35 blocks the through-holes 33a of the first sealing layer 33. The second sealing layer 35 may be formed of any material as long as the material can form a film that is strong enough to block the through-holes 33a. For example, metal such as aluminum, titanium, tungsten, and an alloy of titanium and nickel can be used. In this embodiment, as the material of the second sealing layer 35, aluminum, for example, is adopted. The film thickness of the second sealing layer 35 is not limited to a particular film thickness; in this embodiment, the film thickness of the second sealing layer 35 is set at about 3 μm, for example.

An area surrounded with the second underlayer 4, the wall 26, and the first sealing layer 33 is a hollow portion 36. The wall 26 and the first sealing layer 33 correspond to a covering section that covers the hollow portion 36. In addition, the vibrating element 5 is provided in the hollow portion 36. The pressure in the hollow portion 36 is reduced. As a result, the movable section 7b of the movable electrode 7 easily vibrates due to a small gas resistance. The first sealing layer 33 and the second sealing layer 35 function as a sealing member that seals the hollow portion 36 in a state in which the pressure in the hollow portion 36 is reduced.

On the trace 33b connected to the second penetration electrode 31, one of electrode pads 37 is provided, and the protective film 34 is disposed so as to expose the electrode pad 37. On the protective film 34 and the second sealing layer 35, a resin layer 38 is stacked. The resin layer 38 is disposed so as not to be placed on the electrode pad 37. A trace 39 is provided from apart on the electrode pad 37 to a part on the resin layer 38. In addition, on the trace 39, an external terminal 40 is provided, and the external terminal 40 is electrically connected to the trace 39.

As the material of the resin layer 38, resins such as polyimide resin, silicone-modified polyimide resin, epoxy resin, silicone-modified epoxy resin, BCB (benzocyclobutene), and PBO (polybenzoxazole) can be suitably used. The film thickness of the resin layer 38 is not limited to a particular film thickness; for example, it is preferable that the film thickness of the resin layer 38 be 10 μm or more. This makes it possible to absorb the stress so that the resin layer 38 is not damaged when the oscillator is implemented.

The material of the trace 39 is not limited to a particular material as long as it has electric conductivity. As the trace 39, for example, a metal layer in which a titanium-tungsten alloy layer and a copper layer are stacked in this order, a single-layer structure formed of a metal layer such as a copper layer, a chromium layer, and an aluminum layer, and a stacked structure in which these layers are stacked may be used.

The material of the external terminal 40 is not limited to a particular material as long as it has electric conductivity, and various kinds of metals can be used. In this embodiment, solder, for example, is adopted. The external terminal 40 is formed into a virtually spherical shape.

On the trace 39 and the resin layer 38, a resist layer 41 is stacked. The resist layer 41 is formed so that part of the external terminal 40 is exposed. The resist layer 41 can prevent oxidation and corrosion of the trace 39 and prevent electrical failure caused by dust or the like.

The oscillator 1 can directly provide the external terminal 40 above the substrate 2 formed of, for example, the chip-shaped semiconductor substrate described above. As a result, it is possible to make the package size of the oscillator 1 almost the same as the semiconductor chip.

The drive circuit 10 is connected to the fixed electrode 6 via the first trace 8 and is connected to the movable electrode 7 via the second trace 9. As a result of the drive circuit 10 applying a voltage to the vibrating element 5, static electricity acts on between the fixed electrode 6 and the movable electrode 7. By varying the voltage which is applied to the vibrating element 5, the movable electrode 7 vibrates. This makes it possible to vary the capacitance between the fixed electrode 6 and the movable electrode 7. The frequency characteristics by which the capacitance varies are set by the natural frequency of the movable electrode 7. Therefore, the drive circuit 10 can generate a voltage waveform of a specific frequency by using the vibrating element 5.

Since the pressure in the hollow portion 36 is reduced, the movable electrode 7 vibrates more easily than when the hollow portion 36 is filled with air. Furthermore, the third wall 22 has electric conductivity and is kept at a predetermined voltage via the eighth intermediate terminal 20. The fifth wall 25 and the first sealing layer 33 also have electric conductivity and are kept at a predetermined voltage via the seventh intermediate terminal 17. Therefore, even when an electromagnetic wave which becomes noise propagates from the outside of the oscillator 1, the wall 26 and the first sealing layer 33 can block the propagation of the electromagnetic wave. This makes it possible to make the vibrating element 5 less likely to be affected by the electromagnetic wave which becomes noise.

Assume that the distance between the movable section 7b and the first sealing layer 33 is a first distance 5a and the distance between the movable section 7b and the fixed electrode 6 is a second distance 5b. At this time, the first distance 5a is greater than the second distance 5b. As a result, the movable section 7b is located in a position closer to the fixed electrode 6 than the first sealing layer 33. Therefore, the movable section 7b sticks to the fixed electrode 6 more easily than to the first sealing layer 33.

FIG. 2C is a schematic diagram for explaining a state in which the movable section sticks to the fixing section. As shown in FIG. 2C, when liquid is present between the movable section 7b and the fixed electrode 6, the movable section 7b sometimes sticks to the fixed electrode 6 due to the surface tension of the liquid. This makes it impossible for the movable section 7b to vibrate, making it impossible for the drive circuit 10 to generate a voltage waveform of a specific frequency by using the vibrating element 5.

The drive circuit 10 is connected to the movable electrode 7 by the second trace 9. Furthermore, the drive circuit 10 is connected to the first sealing layer 33 via the trace 33b, the first penetration electrode 30, the second penetration electrode 31, the seventh intermediate terminal 17, and the trace 17a. By applying a voltage to the movable electrode 7 and the first sealing layer 33, the drive circuit 10 can make a potential difference between the movable electrode 7 and the first sealing layer 33 become a predetermined voltage.

As a result, the drive circuit 10 makes the static electricity act on between the movable electrode 7 and the first sealing layer 33 and thereby generate attractive force between the movable electrode 7 and the first sealing layer 33. By drawing the movable section 7b toward the first sealing layer 33, it is possible to separate the movable section 7b from the fixed electrode 6.

Figure 3A:
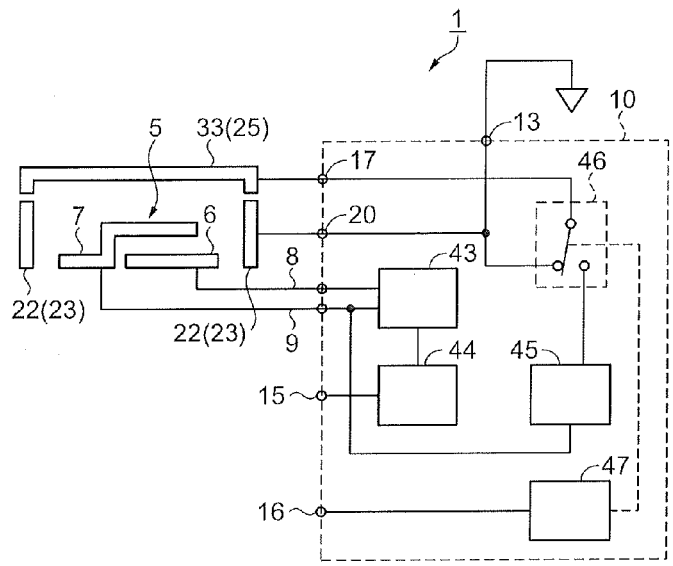
FIG. 3A is a block diagram showing a circuit configuration of the oscillator.

FIG. 3A is a block diagram showing a circuit configuration of the oscillator. As shown in FIG. 3A, the drive circuit 10 of the oscillator 1 has an oscillating circuit 43 and a waveform generation circuit 44. The oscillating circuit 43 is a circuit connected to the vibrating element 5 and generating a waveform of a predetermined frequency. The waveform generation circuit 44 has the functions of changing the frequency of the waveform by dividing the frequency of the waveform which is output from the oscillating circuit 43 and changing the shape of the waveform. For example, the waveform generation circuit 44 outputs the waveform such as a triangular wave, a rectangular wave, or a pulse wave. The waveform generation circuit 44 can output a waveform of a frequency lower than the frequency of the waveform which is output from the oscillating circuit 43 by dividing the frequency of the waveform which is output from the oscillating circuit 43.

The drive circuit 10 further has a voltage circuit 45, a switch section 46, and a switch control circuit 47. The voltage circuit 45 is a circuit generating a voltage necessary for separating the movable electrode 7 from the fixed electrode 6, and is formed of a booster circuit and the like. The switch section 46 is a circuit switching the voltage of the first sealing layer 33 between a ground voltage and a voltage which is output from the voltage circuit 45. The switch control circuit 47 is a circuit switching the switch section 46 in accordance with an instruction signal which is input from the sixth intermediate terminal 16.

When the movable electrode 7 is separated from the fixed electrode 6, the switch control circuit 47 drives the switch section 46 and thereby makes the voltage of the first sealing layer 33 become the ground voltage. At this time, since the third wall 22 and the first sealing layer 33 become the ground voltage, it is possible to make the vibrating element 5 less likely to be affected by the electromagnetic wave noise. When the movable electrode 7 sticks to the fixed electrode 6, the switch control circuit 47 drives the switch section 46 and thereby makes the voltage of the first sealing layer 33 become the voltage which is output from the voltage circuit 45. This makes it possible to make the attractive force act on between the movable electrode 7 and the first sealing layer 33.

Method for Producing an Oscillator

Figure 3B:
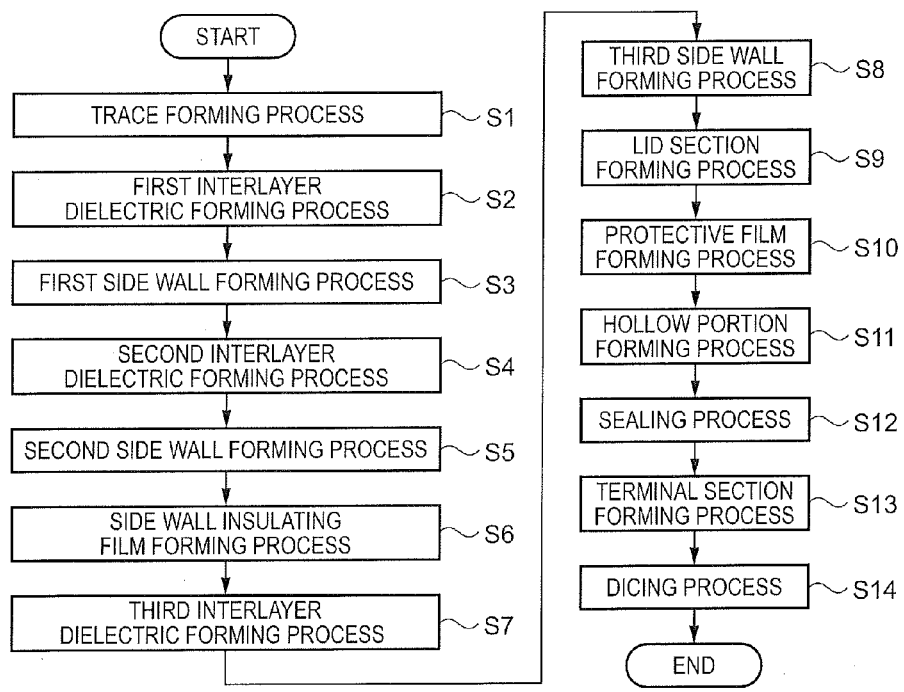
FIG. 3B is a flowchart showing a method for producing the oscillator.

Next, a method for producing the oscillator 1 described above will be described by using FIG. 3B to FIGS. 7A to 7D. FIG. 3B is a flowchart showing a method for producing an oscillator, and FIGS. 4A to 4E to FIGS. 7A to 7D are schematic diagrams for explaining the method for producing the oscillator. Incidentally, the method for producing the drive circuit 10, the third to seventh intermediate terminals 13 to 17, and the traces 13a to 17a is publicly known, and therefore the description thereof is omitted.

In the flowchart of FIG. 3B, step S1 corresponds to a trace forming process and is a process for forming, on a substrate, part of a vibrating element, a trace, an intermediate terminal, a first wall, and a second wall. Next, the procedure proceeds to step S2. Step S2 corresponds to a first interlayer dielectric forming process and is a process for forming a first insulating layer on the vibrating element. Next, the procedure proceeds to step S3. Step S3 corresponds to a first side wall forming process and is a process for forming a third wall. Next, the procedure proceeds to step S4. Step S4 corresponds to a second interlayer dielectric forming process and is a process for forming a second insulating layer so as to be placed on the first insulating layer. Next, the procedure proceeds to step S5. Step S5 corresponds to a second side wall forming process and is a process for forming a fourth wall so as to be placed on the third wall. Next, the procedure proceeds to step S6. Step S6 corresponds to a side wall insulating film forming process and is a process for forming a side wall insulating film. Next, the procedure proceeds to step S7. Step S7 corresponds to a third interlayer dielectric forming process and is a process for forming a third insulating layer so as to be placed on the second insulating layer. Next, the procedure proceeds to step S8. The first interlayer dielectric forming process in step S2, the second interlayer dielectric forming process in step S4, and the third interlayer dielectric forming process in step S7 form an interlayer dielectric forming process. Step S8 corresponds to a third side wall forming process and is a process for forming a fifth wall so as to be placed on the side wall insulating film. Next, the procedure proceeds to step S9. The first side wall forming process in step S3, the second side wall forming process in step S5, the side wall insulating film forming process in step S6, and the third side wall forming process in step S8 form a side wall forming process.

Step S9 corresponds to a lid section forming process and is a process for forming a first sealing layer by stacking the first sealing layer on the fifth wall and in an area surrounded with the fifth wall. Next, the procedure proceeds to step S10. Step S10 corresponds to a protective film forming process and is a process for forming a protective film around the first sealing layer. Next, the procedure proceeds to step S11. Step S11 corresponds to a hollow portion forming process and is a process for forming a cavity by etching the insulating layer covered with the wall and the first sealing layer. Next, the procedure proceeds to step S12. Step S12 corresponds to a sealing process and is a process for sealing the cavity by forming a second sealing layer so as to be placed on the first sealing layer. Next, the procedure proceeds to step S13. Step S13 corresponds to a terminal section forming process and is a process for forming an external terminal that is connected to the intermediate terminal. Next, the procedure proceeds to step S14. Step S14 corresponds to a dicing process and is a process for cutting a mother substrate and dividing the mother substrate into chip-shaped portions. By the production process described above, the oscillator is completed.

Figure 4A:
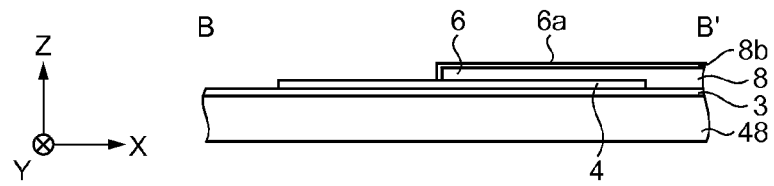
FIGS. 4A to 4E are schematic diagrams for explaining the method for producing the oscillator.
Figure 4B:
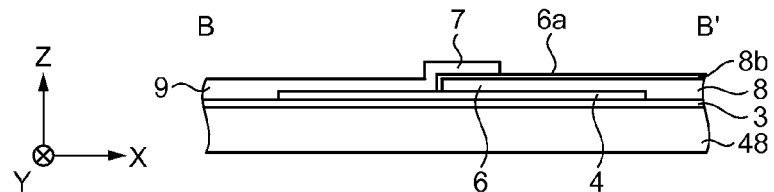
Figure 4C:
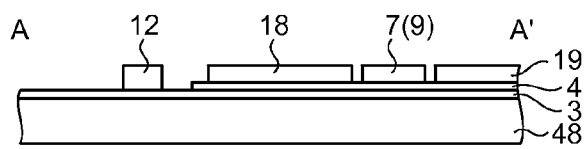

Next, the production method will be described in detail by using FIGS. 4A to 4E to FIGS. 7A to 7D in such a way that the drawings are related to a corresponding one of the steps shown in FIG. 3B. First, FIGS. 4A to 4C are diagrams corresponding to the trace forming process in step S1. As shown in FIG. 4A, a mother substrate 48 is prepared, and a first underlayer 3 and a second underlayer 4 are formed on the mother substrate 48. The second underlayer 4 is formed in an area in which a wall 26 is to be formed. The mother substrate 48 is a silicon wafer, for example, and has a size that allows a plurality of oscillators 1 to be disposed on the mother substrate 48. A portion obtained by dividing the mother substrate 48 into portions corresponds to a substrate 2. The first underlayer 3 is formed by STI (shallow trench isolation) or LOCOS, for example. The second underlayer 4 is formed by using CVD (chemical vapor deposition) or sputtering, for example.

Next, on the second underlayer 4, a fixed electrode 6 is formed, and, on the first underlayer 3 and the second underlayer 4, a first trace 8 is formed. The fixed electrode 6 and the first trace 8 are formed by using film formation performed by CVD, sputtering, or the like and patterning performed by photolithography and etching. After forming a pattern made of polycrystalline silicon, the pattern is doped with predetermined impurities to provide the pattern with electric conductivity. Doping can be performed by, for example, depositing dopant in a gas such as $POCL_3$ or $BBr_3$ and bringing about thermal diffusion of the dopant. Next, by bringing about the thermal oxidation of the fixed electrode 6 and the first trace 8, an insulating film 6a is formed on the surface of the fixed electrode 6 and an insulating film 8b is formed on the surface of the first trace 8.

Figure 4D:
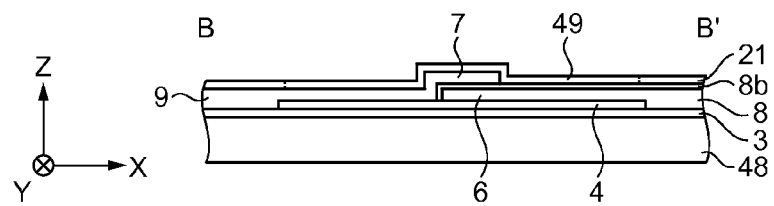
Figure 4E:
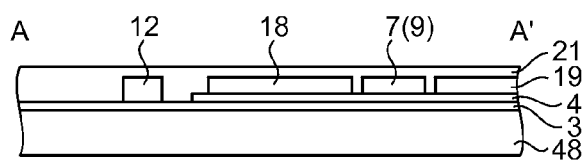

Next, as shown in FIGS. 4B and 4C, a movable electrode 7, a second trace 9, a second intermediate terminal 12, a first wall 18, and a second wall 19 are formed. At the same time, a first intermediate terminal 11 and an eighth intermediate terminal 20 are formed. The method for forming the movable electrode 7, the second trace 9, the first intermediate terminal 11, the second intermediate terminal 12, the first wall 18, the second wall 19, and the eighth intermediate terminal 20 is the same as the method for forming the fixed electrode 6 and the first trace 8, and therefore the description thereof is omitted. FIGS. 4D and 4E are diagrams corresponding to the first interlayer dielectric forming process in step S2. As shown in FIGS. 4D and 4E, a first insulating layer 21 is stacked so as to be placed on the fixed electrode 6, the movable electrode 7, the first trace 8, the second trace 9, the first wall 18, and the second wall 19. The first insulating layer 21 is formed by using film formation performed by CVD, sputtering, or the like. Of the first insulating layer 21, the first insulating layer 21 located in an area which will be surrounded with the first wall 18 and the second wall 19 is referred to as a first sacrifice layer 49.

Figure 5A:
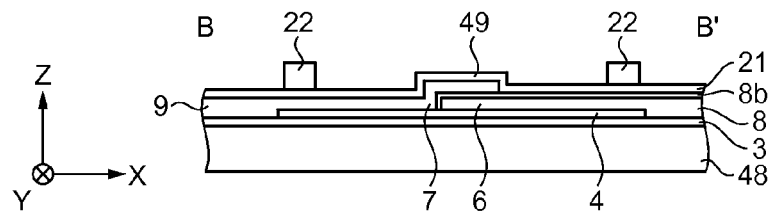
FIGS. 5A to 5E are schematic diagrams for explaining the method for producing the oscillator.
Figure 5B:
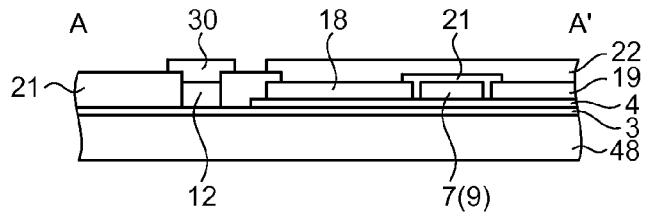

FIGS. 5A and 5B are diagrams corresponding to the first side wall forming process in step S3. As shown in FIGS. 5A and 5B, openings penetrating the first insulating layer 21 are formed by performing patterning on the first insulating layer 21 located on the first wall 18, the second wall 19, and the second intermediate terminal 12. Incidentally, the first insulating layer 21 on the first trace 8 and the second trace 9 is not removed and is left thereon. Next, by filling the openings with metal such as aluminum, a third wall 22 and a first penetration electrode 30 are formed. Incidentally, the third wall 22 and the first penetration electrode 30 may be formed in the same process or in separate processes. The third wall 22 is formed by film formation performed by CVD, sputtering, or the like and patterning performed by photolithography and etching.

The third wall 22 with electric conductivity is formed so as to make contact with the first wall 18 and the second wall 19. This allows a current to flow between the first wall 18 and the second wall 19 via the third wall 22. Between the third wall 22 and the first trace 8 and the second trace 9, the first insulating layer 21 is disposed. Therefore, isolation is provided between the third wall 22 and the first trace 8, and isolation is also provided between the third wall 22 and the second trace 9.

The first penetration electrode 30 is formed so as to make contact with the first to seventh intermediate terminals 11 to 17 and the eighth intermediate terminal 20. As a result, conduction between the first penetration electrode 30 and these terminals is made possible.

Figure 5C:
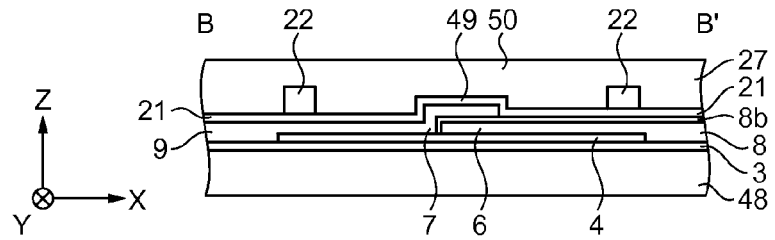
Figure 5D:
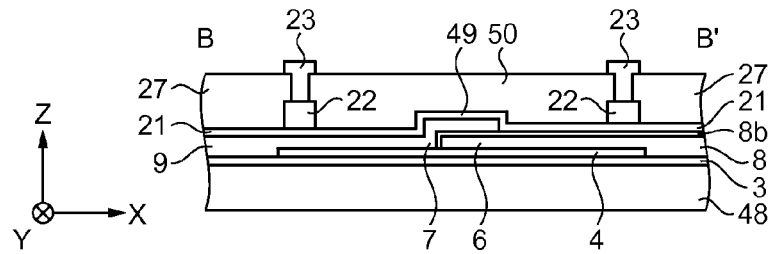

FIG. 5C is a diagram corresponding to the second interlayer dielectric forming process in step S4. As shown in FIG. 5C, in the second interlayer dielectric forming process in step S4, a second insulating layer 27 is formed so as to be placed on the first insulating layer 21. Of the second insulating layer 27, the second insulating layer 27 in an area surrounded with the third wall 22 is referred to as a second sacrifice layer 50. The second insulating layer 27 is formed by using film formation performed by CVD, sputtering, or the like. FIG. 5D is a diagram corresponding to the second side wall forming process in step S5. As shown in FIG. 5D, in the second side wall forming process in step S5, by performing patterning on the second insulating layer 27 located on the third wall 22, openings penetrating the second insulating layer 27 are formed. Next, by filling the openings with metal such as aluminum, a fourth wall 23 is formed. Then, a second penetration electrode 31 is formed on the first penetration electrode 30 in the same process as the process for forming the fourth wall 23. Incidentally, the fourth wall 23 and the second penetration electrode 31 may be formed in the same process or in separate processes. The fourth wall 23 and the second penetration electrode 31 are formed by film formation performed by CVD, sputtering, or the like and patterning performed by photolithography and etching.

Figure 5E:
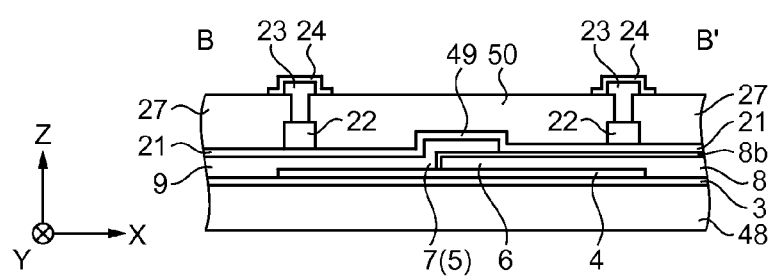

FIG. 5E is a diagram corresponding to the side wall insulating film forming process in step S6. As shown in FIG. 5E, in the side wall insulating film forming process in step S6, an insulating film is stacked on the second insulating layer 27 and the fourth wall 23. The insulating film is formed by using film formation performed by CVD, sputtering, or the like. Next, a side wall insulating film 24 is formed by removing the insulating film in an area other than the area in which the insulating film covers the fourth wall 23. As a result, the side wall insulating film 24 is disposed all around the fourth wall 23 so as to cover the fourth wall 23. The side wall insulating film 24 is formed by patterning performed by photolithography and etching.

The side wall insulating film 24 is disposed on the fourth wall 23 and the second sacrifice layer 50. In addition, the movable electrode 7 is covered with the first sacrifice layer 49 and the second sacrifice layer 50. As a result, the first sacrifice layer 49 protects the vibrating element 5 so that the etchant that etches the side wall insulating film 24 does not damage the movable electrode 7. The above protection is made possible by disposing the side wall insulating film 24 in a position closer to a first sealing layer 33 than the vibrating element 5.

Figure 6A:
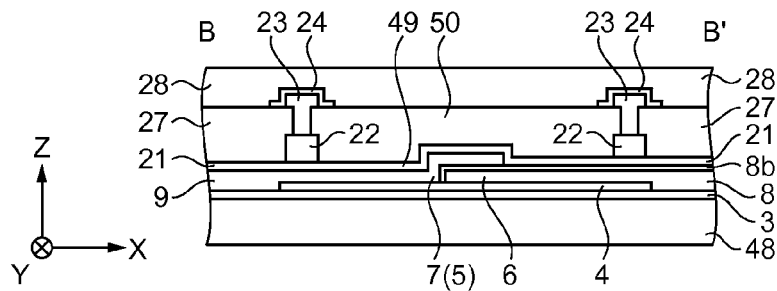
FIGS. 6A to 6D are schematic diagrams for explaining the method for producing the oscillator.

FIG. 6A is a diagram corresponding to the third interlayer dielectric forming process in step S7. As shown in FIG. 6A, in the third interlayer dielectric forming process in step S7, a third insulating layer 28 is formed so as to be placed on the second insulating layer 27. The third insulating layer is formed by using film formation performed by CVD, sputtering, or the like.

Figure 6B:
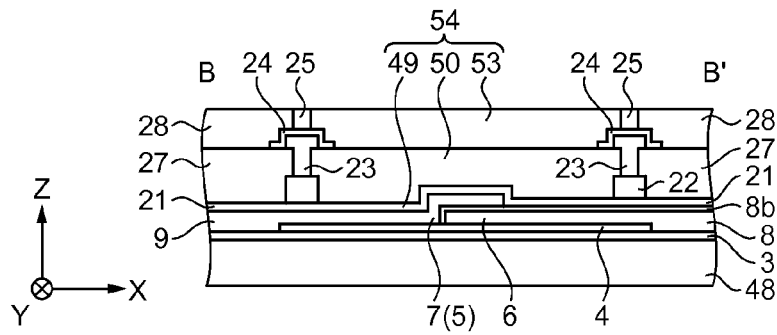

FIG. 6B is a diagram corresponding to the third side wall forming process in step S8. As shown in FIG. 6B, in the third side wall forming process in step S8, openings are formed in areas in the third insulating layer 28, the areas facing the fourth wall 23. The openings are formed in such a way that the side wall insulating film 24 is exposed. Thereafter, by filling the openings with metal such as aluminum, a fifth wall 25 is formed. Then, a third penetration electrode 32 is formed on the second penetration electrode 31 in the same process as the process for forming the fifth wall 25. Incidentally, the fifth wall 25 and the third penetration electrode 32 may be formed in the same process or in separate processes. The fifth wall 25 and the third penetration electrode 32 are formed by film formation performed by CVD, sputtering, or the like and patterning performed by photolithography and etching.

Figure 6C:
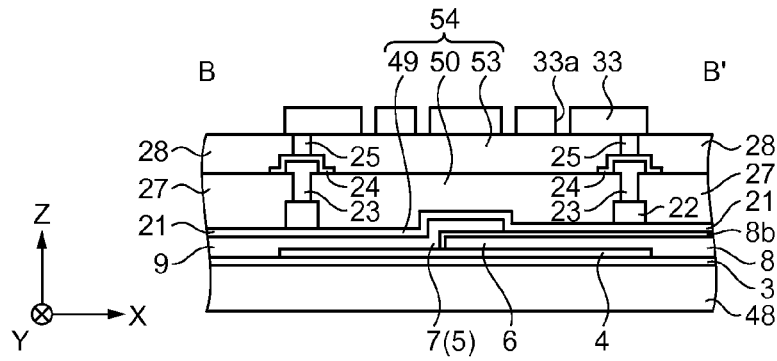

Of the third insulating layer 28, the third insulating layer 28 in an area surrounded with the fifth wall 25 is referred to as a third sacrifice layer 53. The first sacrifice layer 49, the second sacrifice layer 50, and the third sacrifice layer 53 are collectively referred to as a sacrifice layer 54. FIG. 6C is a diagram corresponding to the lid section forming process in step S9. As shown in FIG. 6C, in the lid section forming process in step S9, a metal layer in which a titanium layer, a titanium nitride layer, an aluminum-copper alloy layer, and a titanium nitride layer are stacked in this order is formed so as to be placed on the third insulating layer 28. The metal layer is formed by using film formation performed by sputtering or CVD. Then, a first sealing layer 33 is formed by performing patterning on the metal layer. At this time, through-holes 33a are formed in the first sealing layer 33. Furthermore, an electrode pad 37 is formed on the third penetration electrode 32 by performing patterning on the metal layer. The first sealing layer 33 and the electrode pad 37 are formed by using patterning performed by photolithography and etching. Incidentally, the first sealing layer 33 and the electrode pad 37 may be formed in the same process or in separate processes. Furthermore, the third side wall forming process in step S8 and the lid section forming process in step S9 may be performed in the same process.

Figure 6D:
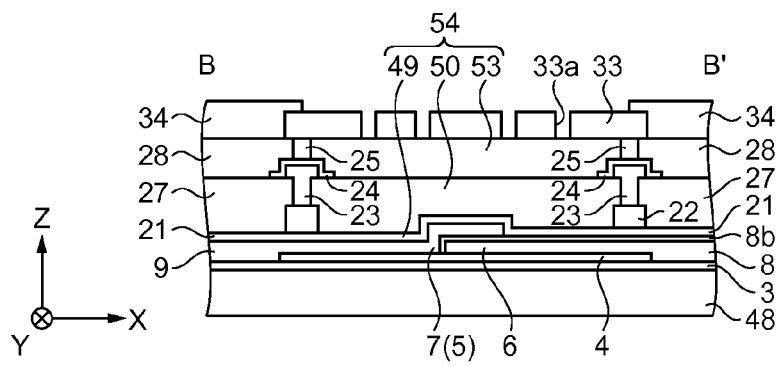
Figure 7A:
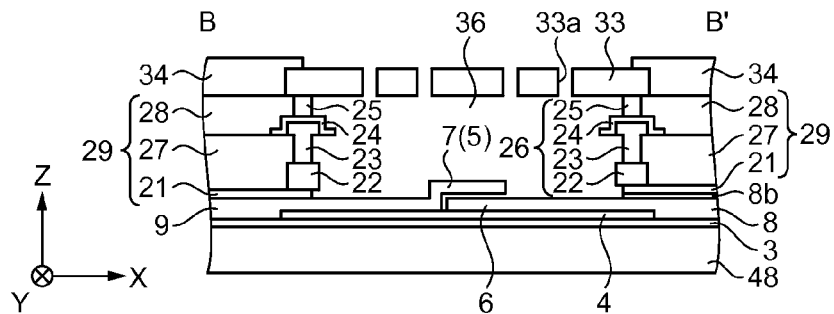
FIGS. 7A to 7D are schematic diagrams for explaining the method for producing the oscillator.

FIG. 6D is a diagram corresponding to the protective film forming process in step S10. As shown in FIG. 6D, in the protective film forming process in step S10, a protective film 34 is formed on the third insulating layer 28 in such a way as to avoid at least part of the first sealing layer 33. At this time, the protective film 34 is formed in such a way that the through-holes 33a formed in the first sealing layer 33 are exposed. The protective film 34 is formed by, for example, patterning performed by photolithography and etching after film formation performed by sputtering, CVD, or the like. FIG. 7A is a diagram corresponding to the hollow portion forming process in step S11. As shown in FIG. 7A, the etchant is made to flow through the through-holes 33a, whereby the sacrifice layer 54 located around the vibrating element 5 is etched. In this way, a hollow portion 36 is formed in an area surrounded with the wall 26 and the first sealing layer 33. At this time, the sacrifice layer 54 located between the fixed electrode 6 and the movable electrode 7 is also removed. This creates clearance between the fixed electrode 6 and the movable electrode 7, which makes it possible for the movable electrode 7 to move. HF vapor etching is adopted as etching.

The second underlayer 4, the wall 26, the first sealing layer 33, and the protective film 34 are formed of a material that is resistant to corrosion by etchant. Therefore, only the sacrifice layer 54 that is surrounded with the second underlayer 4, the wall 26, and the first sealing layer 33 is etched. In addition, an insulating layer 29 in an area surrounding the wall 26 covered with the protective film 34 is left without being etched.

Figure 7B:
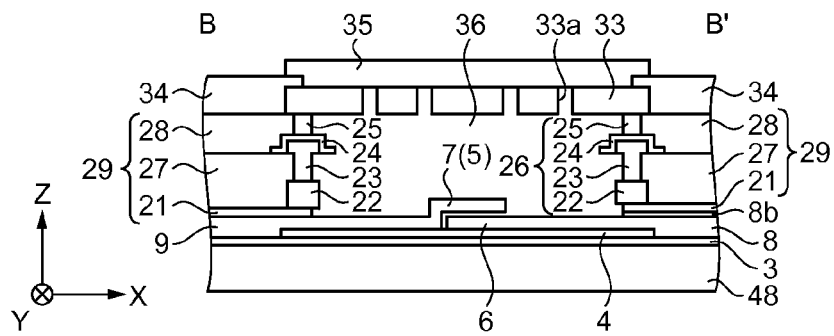

The space between the third wall 22 and the first trace 8, the space between the first wall 18 and the first trace 8, and the space between the second wall 19 and the first trace 8 are set so as to be narrow. Therefore, the etchant that etches the sacrifice layer 54 does not easily leak from the wall 26 to the insulating layer 29 along the first trace 8. Similarly, the space between the third wall 22 and the second trace 9, the space between the first wall 18 and the second trace 9, and the space between the second wall 19 and the second trace 9 are also set so as to be narrow. Therefore, the etchant that etches the sacrifice layer 54 does not easily leak from the wall 26 to the insulating layer 29 along the second trace 9. FIG. 7B is a diagram corresponding to the sealing process in step S12. As shown in FIG. 7B, in the sealing process in step S12, a second sealing layer 35 is formed on the first sealing layer 33 and the protective film 34. As a result, the through-holes 33a are blocked and the hollow portion 36 is sealed. The second sealing layer 35 is formed by, for example, a vapor phase epitaxial method such as sputtering or CVD. At this time, the second sealing layer 35 is formed in a reduced pressure state. As a result, the hollow portion 36 can be sealed while being kept in a reduced pressure state.

Figure 7C:
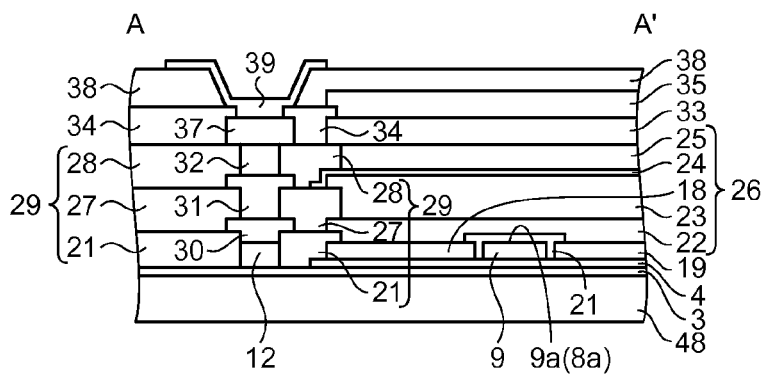
Figure 7D:
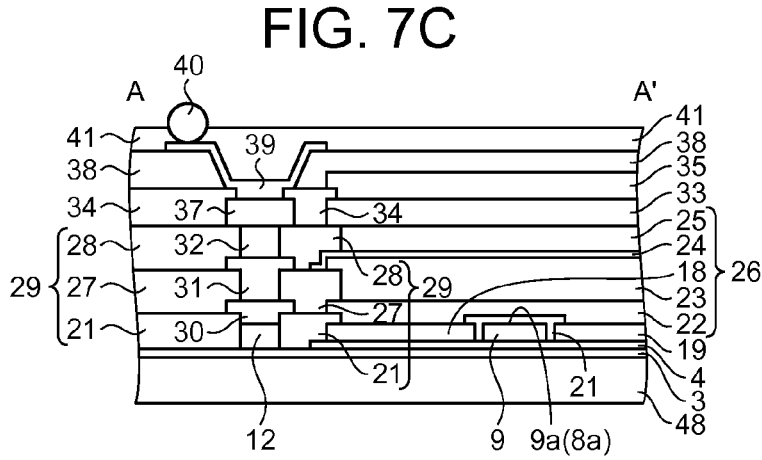

FIGS. 7C and 7D are diagrams corresponding to the terminal section forming process in step S13. As shown in FIG. 7C, in the terminal section forming process in step S13, in an area other than the top surface of the electrode pad 37, a resin layer 38 is formed on the protective film 34 and the second sealing layer 35. More specifically, an opening is first formed in the protective film 34 on the top surface of the electrode pad 37 by performing patterning on the protective film 34 by photolithography and etching. Next, resin is applied thereto by spin coating and heat treatment is performed at about 300 to 400° C. in an atmosphere of nitrogen. By doing so, the applied resin is cured and a film of resin is formed. Next, patterning is performed on the film of resin by photolithography and etching, whereby the resin layer 38 is formed. Then, a trace 39 is formed on the electrode pad 37 and the resin layer 38. The trace 39 is formed by film formation performed by sputtering, plating, or the like and patterning performed by photolithography and etching.

Next, as shown in FIG. 7D, a resist layer 41 is formed on the resin layer 38 and the trace 39. The resist layer 41 is formed in an area other than an area in which an external terminal 40 of the trace 39 is to be formed. The resist layer 41 is formed by, for example, film formation performed by spin coating or the like and patterning performed by photolithography and etching.

Then, the external terminal 40 is formed on the trace 39. For example, a solder film is formed on the trace 39 and is then melted by being heated at about 180 to 300° C., whereby the solder is liquefied, and, due to the action of the surface tension of the liquefied solder, the external terminal 40 is formed into a spherical shape.

In the dicing process in step S14, a mother substrate 48 is cut along cut lines. The mother substrate 48 is pasted on an adhesive sheet. Then, incisions are made along the cut lines by using a rotary knife with a tip to which diamond powder is applied. Thereafter, the sheet is spread, whereby the mother substrate 48 is cleaved along the cut lines. Then, the chip-shaped oscillators 1 separate from one another. As a result, as shown in FIG. 1, the oscillator 1 is completed. As described above, according to this embodiment, the following effects are obtained.

(1) According to this embodiment, the hollow portion 36 covered with the wall 26 and the first sealing layer 33 is provided on the substrate 2. In the hollow portion 36, the movable section 7b is disposed. The area facing the movable section 7b is the first sealing layer 33. In addition, the movable section 7b is located between the first sealing layer 33 and the substrate 2. The movable section 7b and the first sealing layer 33 are electric conductors. Therefore, by applying a voltage to the movable section 7b and the first sealing layer 33, it is possible to accumulate static electricity in the movable section 7b and the first sealing layer 33. This makes it possible to generate the attractive force between the movable section 7b and the first sealing layer 33. When the movable section 7b sticks to the fixed electrode 6 and does not separate therefrom, it is possible to separate the movable section 7b from the fixed electrode 6 by generating the attractive force between the movable section 7b and the first sealing layer 33.

(2) According to this embodiment, in the wall 26, the side wall insulating film 24 is disposed between the third wall 22 and the fifth wall 25. The side wall insulating film 24 provides isolation between the third wall 22 and the fifth wall 25. The side wall insulating film 24 is located in a position closer to the first sealing layer 33 than the movable electrode 7. The side wall insulating film 24 is formed after the formation of the third wall 22. The side wall insulating film 24 is formed by forming a wide film and then etching the film so as to leave an area which abuts on the third wall 22.

When the side wall insulating film 24 is located in a position closer to the substrate 2 than the movable electrode 7, there is a possibility that a film which is not yet etched to form the side wall insulating film 24 will make contact with the movable electrode 7. At this time, since the etchant that etches the side wall insulating film 24 makes contact with the movable electrode 7, there is a possibility that the movable electrode 7 will be damaged by the etchant. On the other hand, in this embodiment, the side wall insulating film 24 is located in a position closer to the first sealing layer 33 than the movable electrode 7. Therefore, by disposing the first sacrifice layer 49 between the area in which the side wall insulating film 24 is disposed and the substrate 2, it is possible to form the side wall insulating film 24 in such a way that the side wall insulating film 24 which is not yet etched does not make contact with the movable electrode 7. In addition, by removing the first sacrifice layer 49 around the movable electrode 7 after etching the side wall insulating film 24, it is possible to prevent the etchant that etches the side wall insulating film 24 from damaging the movable electrode 7.

(3) According to this embodiment, the voltage circuit 45, the switch section 46, and the switch control circuit 47 are mounted on the oscillator 1. The voltage circuit 45 generates a voltage, and the switch control circuit 47 can switch between a state in which the voltage is applied between the first sealing layer 33 and the movable electrode 7 and a state in which the voltage is not applied between them by driving the switch section 46. This makes it possible to control whether or not to make the attractive force act on between the first sealing layer 33 and the movable electrode 7.

(4) According to this embodiment, the fixed electrode 6, the movable section 7b, and the first sealing layer 33 are disposed in such a way that the first distance 5a becomes greater than the second distance 5b. As a result, the movable section 7b is located in a position closer to the fixed electrode 6 than the first sealing layer 33. Therefore, the movable section 7b sticks to the fixed electrode 6 more easily than to the first sealing layer 33. When the movable section 7b sticks to both the first sealing layer 33 and the fixed electrode 6, it is necessary to provide the switch section 46 that controls the attractive force between the movable section 7b and the first sealing layer 33 and the switch section 46 that controls the attractive force between the movable section 7b and the fixed electrode 6. On the other hand, in this embodiment, it is necessary to provide only the switch section 46 that controls the attractive force between the movable section 7b and the first sealing layer 33. This makes it possible to simplify the control of the switch section 46.

(5) According to this embodiment, the oscillator 1 includes the vibrating element 5 and the oscillating circuit 43, and the oscillating circuit 43 generates a waveform by using the vibrating element 5. Therefore, it is possible to output a waveform of a particular frequency. Furthermore, the oscillator 1 includes the waveform generation circuit 44. Therefore, it is possible to vary the frequency and the waveform pattern of the waveform generated by the oscillating circuit 43.

Second Embodiment

Next, an embodiment of the oscillator will be described by using schematic sectional views of FIGS. 8A and 8B, the schematic sectional views of principal portions of the oscillator. This embodiment differs from the first embodiment in the position of the side wall insulating film 24 shown in FIGS. 2A to 2C. Incidentally, descriptions of the same portions as those in the first embodiment will be omitted.

Figure 8A:
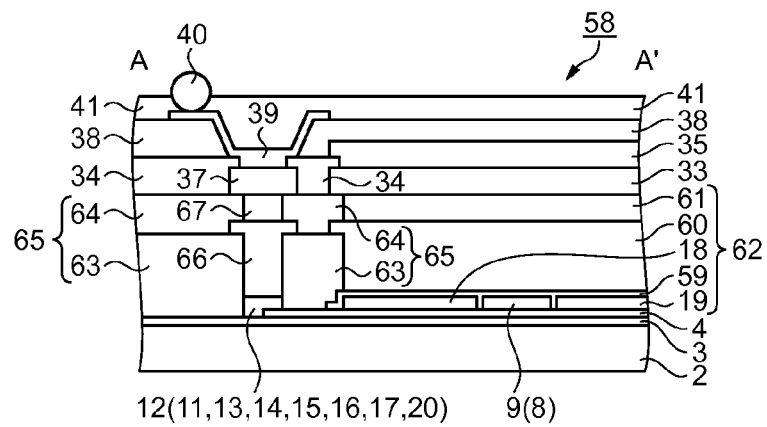
FIGS. 8A and 8B are schematic sectional views of principal portions of an oscillator according to a second embodiment.
Figure 8B:
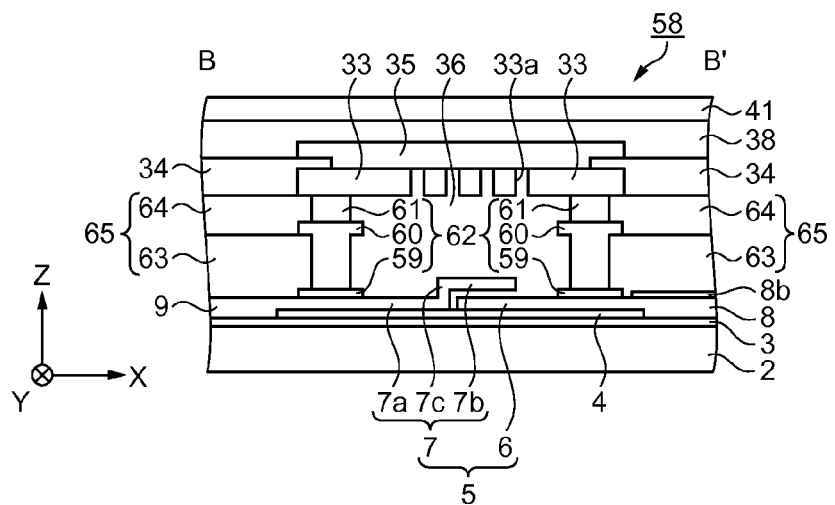

FIGS. 8A and 8B are schematic sectional views of principal portions of an oscillator. FIG. 8A corresponds to FIG. 2A, and FIG. 8B corresponds to FIG. 2B. That is, in this embodiment, as shown in FIGS. 8A and 8B, an oscillator 58 includes a substrate 2, and a first underlayer 3 and a second underlayer 4 are stacked on the substrate 2 in this order. In addition, on the second underlayer 4, a vibrating element 5, a first trace 8, a second trace 9, a first wall 18, and a second wall 19 are provided. The first wall 18 and the second wall 19 are electrically connected via an unillustrated trace.

On the first wall 18 and the second wall 19, a side wall insulating film 59 is provided. On the X direction's-side of the vibrating element 5, the side wall insulating film 59 is disposed so as to straddle the first trace 8 and connect the first wall 18 and the second wall 19. Furthermore, the side wall insulating film 59 is also provided between the first wall 18 and the first trace 8 and between the second wall 19 and the first trace 8.

Similarly, on the −X direction's-side of the vibrating element 5, the side wall insulating film 59 is disposed so as to straddle the second trace 9 and connect the first wall 18 and the second wall 19. Furthermore, the side wall insulating film 59 is also provided between the first wall 18 and the second trace 9 and between the second wall 19 and the second trace 9.

On the side wall insulating film 59, a fifth wall 60 and a sixth wall 61 are stacked. The fifth wall 60 and the sixth wall 61 correspond to the third wall 22, the fourth wall 23, and the fifth wall 25 in the first embodiment. The first wall 18, the second wall 19, the side wall insulating film 59, the fifth wall 60, and the sixth wall 61 form a wall 62 that surrounds the vibrating element 5.

The side wall insulating film 59 is a film formed of the same material as the side wall insulating film 24 in the first embodiment, has electrical insulation properties, and is resistant to etching by the etchant that etches silicon dioxide. As a result, the first trace 8 and the second trace 9 are electrically-insulated from the first wall 18 and the second wall 19. Furthermore, the fifth wall 60 is electrically-insulated from the first trace 8, the second trace 9, the first wall 18, and the second wall 19.

The side wall insulating film 59 is resistant to etching by the etchant that etches a sacrifice layer 54. This makes it possible to prevent the etchant from flowing to the outside of the wall 62 through the gap between the first trace 8 and the second trace 9 and the wall 62 when a hollow portion 36 is formed.

On the periphery of the side wall insulating film 59 and the fifth wall 60, a fourth insulating layer 63 is disposed, and, on the periphery of the sixth wall 61, a fifth insulating layer 64 is disposed. In addition, the fourth insulating layer 63 and the fifth insulating layer 64 form an insulating layer 65. The insulating layer 65 is a layer corresponding to the insulating layer 29 in the first embodiment. A fourth penetration electrode 66 and a fifth penetration electrode 67 are disposed so as to be placed on first to seventh intermediate terminals 11 to 17 and an eighth intermediate terminal 20. The fourth penetration electrode 66 and the fifth penetration electrode 67 correspond to the first to third penetration electrodes 30 to 32. The portions above the wall 62, the insulating layer 65, and the hollow portion 36 have the same structure as the first embodiment, and their descriptions will be omitted.

The side wall insulating film 59 provides isolation between the movable electrode 7 and the first sealing layer 33. In addition, the side wall insulating film 59 also provides isolation between the fixed electrode 6 and the first sealing layer 33. Therefore, when the movable electrode 7 sticks to the fixed electrode 6, it is possible to make the attractive force act on between the movable electrode 7 and the first sealing layer 33 by applying a voltage between the movable electrode 7 and the first sealing layer 33.

As described above, according to this embodiment, the following effects are obtained.

(1) According to this embodiment, the side wall insulating film 59 is located between the first trace 8 and the second trace 9 and the first wall 18, the second wall 19, and the fifth wall 60 which are located next to the first trace 8 and the second trace 9. The side wall insulating film 59 is resistant to etching by the etchant that etches the sacrifice layer 54. Therefore, it is possible to prevent the etchant from flowing to the outside of the wall 62 from between the first trace 8 and the second trace 9 and the first wall 18, the second wall 19, and the fifth wall 60 when the hollow portion 36 is formed.

(2) According to this embodiment, since the fifth wall 60, the sixth wall 61, and the first sealing layer 33 are electric conductors and are electrically connected, the fifth wall 60, the sixth wall 61, and the first sealing layer 33 are at the same potential. In addition, since the fifth wall 60, the sixth wall 61, and the first sealing layer 33 cover the vibrating element 5, it is possible to make the vibrating element 5 less likely to be affected by the electromagnetic wave noise.

(3) According to this embodiment, the side wall insulating film 59 provides isolation between the movable section 7b and the first sealing layer 33. Therefore, when the movable section 7b sticks to the fixed electrode 6, it is possible to make the attractive force act on between the movable section 7b and the first sealing layer 33 by applying a voltage to the movable section 7b and the first sealing layer 33. This makes it possible to separate the movable section 7b from the fixed electrode 6.

Third Embodiment

Next, an embodiment of a timepiece which is one of electronic apparatuses using the oscillator will be described by using FIG. 9. This embodiment differs from the first embodiment in that it is an electronic apparatus using the oscillator. Incidentally, descriptions of the same portions as those in the first embodiment will be omitted.

Figure 9:
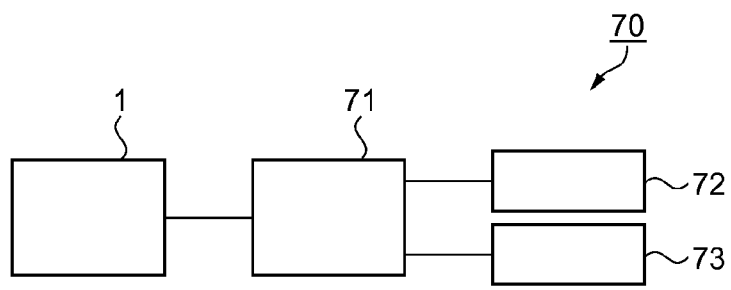
FIG. 9 is an electric block diagram showing the configuration of a timepiece according to a third embodiment.

FIG. 9 is an electric block diagram showing the configuration of a timepiece. As shown in FIG. 9, a timepiece 70 as an electronic apparatus includes a control section 71. The control section 71 is connected to an oscillator 1, and the oscillator 1 outputs a rectangular wave signal of a constant frequency to the control section 71. The control section 71 includes an arithmetic section, and the arithmetic section performs various kinds of operations in synchronization with the rectangular wave signal.

The control section 71 includes a display section 72 and an input section 73. The display section 72 is a device on which the arithmetic section of the control section 71 displays operation results, and a liquid crystal display device, an organic EL (electro-luminescence) display device, an analog display device using an hour hand and a minute hand, or the like can be used as the display section 72. As the input section 73, a push-button switch, a rotary dial, or the like can be used.

The timepiece 70 has the function of displaying the current time. An operator inputs a time at a predetermined time by using the input section 73. By using the output of the oscillator 1, the control section 71 calculates how much time has elapsed and outputs, to the display section 72, the current time calculated by adding the elapsed time to the time at which the input was made. The display section 72 receives the signal from the control section 71 and displays the current time. The timepiece 70 has the function of a stopwatch. The operator inputs a timing start instruction signal by pressing a button switch by using the input section 73. By using the output of the oscillator 1, the control section 71 calculates how much time has elapsed. The control section 71 calculates the time that has elapsed from the time at which the input of the timing start signal was made, and outputs the calculation result to the display section 72. The display section 72 receives the signal from the control section 71 and displays the elapsed time.

As described above, according to this embodiment, the following effects are obtained.

(1) According to this embodiment, the timepiece 70 includes the oscillator 1. When the movable section 7b sticks to the fixed electrode 6 and does not separate therefrom, the oscillator 1 can separate the movable section 7b from the fixed electrode 6 by generating the attractive force between the movable section 7b and the first sealing layer 33. Therefore, the timepiece 70 can be provided as an apparatus provided with the oscillator 1 in which the vibrating element 5 can be restored.

It is to be understood that the embodiment is not limited to the embodiments described above, and various modifications and improvements are possible. Modified examples are described below.

Modified Example 1

In the first embodiment described above, as shown in FIG. 1, the planar shape of the wall 26 is a quadrangular frame-like shape. However, the planar shape of the wall 26 is not limited to a particular shape as long as the wall 26 surrounds the vibrating element 5; the planar shape of the wall 26 may be any shape such as a circular, oval, and polygonal frame-like shape. This makes it possible to increase the flexibility of placement of the trace, the terminal, and the drive circuit 10.

Modified Example 2

In the first embodiment described above, the side wall insulating film 24 is disposed between the third wall 22 and the fifth wall 25. The side wall insulating film 24 may be disposed between the third wall 22 and the fourth wall 23. Also in this case, by making the attractive force act on between the movable section 7b and the first sealing layer 33 by applying a voltage between them, it is possible to separate the movable section 7b from the fixed electrode 6. When the side wall insulating film 24 is disposed between the third wall 22 and the fourth wall 23, the fifth wall 25 and the third insulating layer 28 may be omitted. This makes it possible to reduce the number of processes and thereby produce the oscillator with great productivity.

Modified Example 3

In the first embodiment described above, the movable section 7b and the first sealing layer 33 are electric conductors; however, a film of an electric conductor may be disposed on a member which is an electrical insulator. Also in this case, it is possible to make the attractive force by static electricity act on between the movable section 7b and the first sealing layer 33. Moreover, it is possible to expand the scope of material selection.

Modified Example 4

In the first embodiment described above, the switch control circuit 47 controls the switch section 46 and thereby controls a voltage which is applied to the first sealing layer 33; however, the invention is not limited thereto. A second switch section by which a voltage which is output from the voltage circuit 45 is applied between the fixed electrode 6 and the movable electrode 7 may be provided. The switch control circuit 47 may control the second switch section and thereby controls a voltage which is applied between the fixed electrode 6 and the movable electrode 7.

When the movable electrode 7 sticks to the first sealing layer 33, the switch control circuit 47 drives the second switch section so that the voltage between the fixed electrode 6 and the movable electrode 7 becomes a voltage which is output from the voltage circuit 45. This makes it possible to make the attractive force act on between the fixed electrode 6 and the movable electrode 7. When the movable electrode 7 sticks to the first sealing layer 33, it is also possible to separate the movable electrode 7 from the first sealing layer 33.

Modified Example 5

In the third embodiment described above, the oscillator 1 is used; however, the oscillator 58 may be used in place of the oscillator 1. Also in this case, it is possible to use a waveform of a predetermined frequency with high quality.

Modified Example 6

In the third embodiment described above, a case in which the timepiece 70 is taken up as an example of the electronic apparatuses using the oscillator 1 has been described; however, the electronic apparatus is not limited to the timepiece 70. The oscillator 1 can be applied to various kinds of electronic apparatuses. For example, the oscillator 1 can be used in a mobile telephone, a personal computer, an electronic dictionary, a digital camera, a digital recording/reproducing apparatus, and the like. At this time, when the movable section 7b sticks to the fixed electrode 6 and does not separate therefrom, the oscillator 1 can separate the movable section 7b from the fixed electrode 6 by generating the attractive force between the movable section 7b and the first sealing layer 33. Therefore, the electronic apparatus can be provided as an apparatus provided with the oscillator 1 in which the vibrating element 5 can be restored.

The entire disclosure of Japanese Patent Application No. 2010-266217, filed Nov. 30, 2010 is expressly incorporated by reference herein.

What is claimed is:

1. A microelectronic device comprising:
    a movable section located in a hollow portion covered with a covering section comprising a lid section and a sidewall section on a substrate;
    a fixing section that is provided on the substrate, the fixing section facing the movable section;
    the lid section located in the covering section in an area facing the movable section;
    a side wall insulating film that is located in the covering section between the substrate and the lid section and provides isolation between the substrate and the lid section;
    a switch circuit that is configured by a three-terminal switch selectively connecting among the movable section, the lid section and the sidewall section so as to switch between a first state and a second state; and
    a voltage circuit that supplies a voltage,
    wherein
    the side wall insulating film is located between the lid section and the sidewall section so as to electrically separate the lid section from the sidewall section,
    the movable section is located between the substrate and the lid section,
    the movable section, the sidewall section and the lid section are electric conductors,
    when the first state is selected by the switch circuit, the sidewall section and the lid section are connected to a ground potential at the same time, and
    when the second state is selected by the switch circuit, the voltage circuit supplies the voltage between the lid section and the movable section at the same time and the sidewall section is connected to the ground potential.

2. The microelectronic device according to claim 1, wherein at least part of the fixing section is an electric conductor.

3. The microelectronic device according to claim 2, wherein the side wall insulating film is located in a position closer to the lid section than the movable section.

4. The microelectronic device according to claim 1, wherein the fixing section is a fixed electrode, and
    a first distance between the lid section and the movable section is greater than a second distance between the movable section and the fixed electrode.

5. The microelectronic device according to claim 1, further comprising:
    an oscillating circuit generating a waveform by using the movable section.

6. An electronic apparatus comprising:
    the microelectronic device according to claim 1; and
    an oscillation circuit that generates a waveform in accordance with movement of the moveable section.

7. An electronic apparatus comprising:
    the microelectronic device according to claim 2; and
    an oscillation circuit that generates a waveform in accordance with movement of the moveable section.

8. An electronic apparatus comprising:
    the microelectronic device according to claim 3; and
    an oscillation circuit that generates a waveform in accordance with movement of the moveable section.

9. An electronic apparatus comprising:
    the microelectronic device according to claim 4; and
    an oscillation circuit that generates a waveform in accordance with movement of the moveable section.

10. An electronic apparatus comprising:
    the microelectronic device according to claim 5; and
    an oscillation circuit that generates a waveform in accordance with movement of the moveable section.

11. The microelectronic device according to claim 1, wherein when the movable section is separated from the fixing section, the voltage is not applied between the lid section and the movable section, and the lid section is connected to the ground potential.

12. An microelectronic device comprising:
    a substrate;
    a covering section that is located on the substrate and covers a hollow portion;
    a movable section located in the hollow portion, the movable section in which at least part thereof is an electric conductor;
    a fixing section that is provided on the substrate, the fixing section facing the movable section; and
    a switch circuit that switches between a first state and a second state,
    wherein
    the covering section has a side wall surrounding the movable section in a plan view and a lid section that overlaps the side wall in the plan view,
    the side wall includes a side wall insulating film and a surrounding wall,
    the lid section and the surrounding wall are electric conductors, the side wall insulating film is located between the lid section and the surrounding wall so as to electrically separate the lid section from the surrounding wall, the switch circuit is configured by a three-terminal switch selectively connecting among the movable section, the lid section and the surrounding wall so as to switch between the first state and the second state, when the first state is selected by the switch circuit, the surrounding wall and the lid section are connected to a ground potential at the same time, and when the second state is selected by the switch circuit, a voltage is applied between the lid section and the movable section at the same time and the surrounding wall is connected to the ground potential.

13. The microelectronic device according to claim 12, wherein when the movable section is separated from the fixing section, the voltage is not applied between the lid section and the movable section, and the lid section is connected to the ground potential.

\* \* \* \* \*